US009084050B2

(12) United States Patent
Hillis et al.

(10) Patent No.: US 9,084,050 B2
(45) Date of Patent: Jul. 14, 2015

(54) SYSTEMS AND METHODS FOR REMAPPING AN AUDIO RANGE TO A HUMAN PERCEIVABLE RANGE

(71) Applicant: Elwha LLC, Bellevue, WA (US)

(72) Inventors: W. Daniel Hillis, Encino, CA (US); Roderick A. Hyde, Redmond, WA (US); Muriel Y. Ishikawa, Livermore, CA (US); Jordin T. Kare, Seattle, WA (US); Lowell L. Wood, Jr., Bellevue, WA (US); Victoria Y. H. Wood, Livermore, CA (US)

(73) Assignee: ELWHA LLC, Bellevue, WA (US)

( * ) Notice: Subject to any disclaimer, the term of this patent is extended or adjusted under 35 U.S.C. 154(b) by 0 days.

(21) Appl. No.: 13/941,326

(22) Filed: Jul. 12, 2013

(65) Prior Publication Data

US 2015/0016632 A1 Jan. 15, 2015

(51) Int. Cl.
*H03G 5/00* (2006.01)
*H04R 3/04* (2006.01)
*H04R 25/00* (2006.01)

(52) U.S. Cl.
CPC ................ *H04R 3/04* (2013.01); *H04R 25/353* (2013.01)

(58) Field of Classification Search
CPC ...... H04R 3/04; H04R 25/353; H04R 25/356; H04R 25/35; H04R 2225/43
USPC ............. 381/98, 61, 316, 99, 101, 94.2, 94.3, 381/56; 704/E21.001, E21.009
See application file for complete search history.

(56) References Cited

U.S. PATENT DOCUMENTS 4,629,834 A * 12/1986 Waggoner et al. ............ 381/316
4,982,434 A * 1/1991 Lenhardt et al. .............. 381/326
5,274,711 A * 12/1993 Rutledge et al. .............. 704/225
5,889,870 A 3/1999 Norris
6,169,813 B1 * 1/2001 Richardson et al. .......... 381/312
6,173,062 B1 * 1/2001 Dibachi et al. ................ 381/312
6,212,496 B1 * 4/2001 Campbell et al. ............. 704/221

(Continued)

FOREIGN PATENT DOCUMENTS

CA 2621175 A1 * 3/2007
JP 10-174195 6/1998
WO WO 2007000161 A1 * 1/2007 ............. H04R 25/00

OTHER PUBLICATIONS

Glista, Danielle et al., "Modified Verification Approaches for Frequency Lowering Devices", Audiology Online, Nov. 9, 2009, 8 pages.

(Continued)

*Primary Examiner* — Xu Mei
(74) *Attorney, Agent, or Firm* — Foley & Lardner LLP

(57) ABSTRACT

A system for remapping an audio range to a human perceivable range includes an audio transducer configured to output audio and a processing circuit. The processing circuit is configured to receive the audio from an audio input, analyze the audio to determine a first audio range, a second audio range, and a third audio range. The processing circuit is further configured to use frequency compression on the first audio range based on the second audio range and third audio range to create a first open frequency range, move the second audio range into the first open frequency range to create a second open frequency range, move the third audio range into the second open frequency range, and provide audio output including the compressed first audio range, the moved second audio range, and the moved third audio range.

35 Claims, 10 Drawing Sheets

(56) References Cited

U.S. PATENT DOCUMENTS

| | | | | |
|---|---|---|---|---|
| 6,363,139 | B1 * | 3/2002 | Zurek et al. | 379/56.1 |
| 6,577,739 | B1 * | 6/2003 | Hurtig et al. | 381/316 |
| 6,731,769 | B1 * | 5/2004 | Lenhardt | 381/316 |
| 7,317,958 | B1 * | 1/2008 | Freed et al. | 700/94 |
| 8,019,431 | B2 * | 9/2011 | Nie et al. | 607/57 |
| 8,244,535 | B2 * | 8/2012 | Hubner et al. | 704/260 |
| 2005/0027537 | A1 * | 2/2005 | Krause et al. | 704/271 |
| 2005/0232452 | A1 | 10/2005 | Armstrong et al. | |
| 2006/0159285 | A1 * | 7/2006 | Reber et al. | 381/98 |
| 2006/0188115 | A1 * | 8/2006 | Lenhardt et al. | 381/312 |
| 2006/0241938 | A1 * | 10/2006 | Hetherington et al. | 704/208 |
| 2006/0245604 | A1 * | 11/2006 | Spielbauer et al. | 381/106 |
| 2007/0174050 | A1 * | 7/2007 | Li et al. | 704/208 |
| 2007/0253585 | A1 * | 11/2007 | Steinbuss | 381/312 |
| 2009/0245539 | A1 * | 10/2009 | Vaudrey et al. | 381/109 |
| 2009/0304198 | A1 * | 12/2009 | Herre et al. | 381/66 |
| 2009/0312820 | A1 * | 12/2009 | Nie et al. | 607/57 |
| 2010/0094619 | A1 * | 4/2010 | Hubner et al. | 704/206 |
| 2011/0038496 | A1 | 2/2011 | Lott et al. | |
| 2011/0150256 | A1 * | 6/2011 | Baechler et al. | 381/316 |
| 2011/0228948 | A1 * | 9/2011 | Engel | 381/74 |
| 2011/0249843 | A1 * | 10/2011 | Holmberg et al. | 381/316 |
| 2011/0249845 | A1 * | 10/2011 | Kates | 381/317 |
| 2012/0008798 | A1 * | 1/2012 | Ong | 381/98 |
| 2012/0076333 | A1 * | 3/2012 | Bauml et al. | 381/316 |
| 2012/0140964 | A1 * | 6/2012 | Chao et al. | 381/316 |
| 2012/0148082 | A1 | 6/2012 | Norris | |
| 2013/0089227 | A1 * | 4/2013 | Kates | 381/316 |
| 2013/0322671 | A1 * | 12/2013 | Alexander | 381/316 |

OTHER PUBLICATIONS

Kuk, Francis et al., “Linear Frequency Transposition: Extending the Audibility of High-Frequency Information”, from HearingView.com (http://web.archive.org/web/20080706115401/http://www.hr-hpr.com/issues/articles/2006-10_08), retrieved on Oct. 2, 2013, 6 pages.

Ross, Mark, “Dr. Ross on Hearing Loss—Frequency Compression Hearing Aids”, from Hearingresearch.org (www.hearingresearch.org/ross/hearing_aids/frequency_compression_hearing_aids.php) retrieved Sep. 6, 2013, 5 pages.

Scollie, Susan et al., “Multichannel Nonlinear Frequency Compression: A New Technology for Children with Hearing Loss”, from Phonakpro.com (www.phonakpro.com/content/dam/phonak/b2b/Pediatrics/webcasts/pediatric/com_24_p61899_pho_kapitel_13.pdf), retrieved Sep. 6, 2013, pp. 151-159.

PCT International Search Report; International App. No. PCT/US2014/046289; Nov. 6, 2014; pp. 1-5.

* cited by examiner

SYSTEMS AND METHODS FOR REMAPPING AN AUDIO RANGE TO A HUMAN PERCEIVABLE RANGE

BACKGROUND

A frequency range may be out of the range of human perceivable sound, or a hearing impairment may cause a person to lose the ability to perceive a certain frequency range. A hearing device may be used to process and remap the frequencies of audio that are out of range in order to assist the person in perceiving the audio. The out of range frequencies may be remapped without losing the audio within the normal range of perception.

SUMMARY

One embodiment relates to a system for remapping an audio range to a human perceivable range, including an audio transducer configured to output audio and a processing circuit. The processing circuit is configured to receive the audio from an audio input, analyze the audio to determine a first audio range, a second audio range, and a third audio range. The processing circuit is further configured to use frequency compression on the first audio range based on the second audio range and third audio range to create a first open frequency range, move the second audio range into the first open frequency range to create a second open frequency range, move the third audio range into the second open frequency range, and provide audio output including the compressed first audio range, the moved second audio range, and the moved third audio range.

Another embodiment relates to a method for remapping an audio range to a human perceivable range. The method includes receiving audio from an audio input and analyzing the audio to determine a first audio range, a second audio range, and a third audio range. The method further includes using frequency compression on the first audio range based on the second audio range and third audio range to create a first open frequency range, moving the second audio range into the first open frequency range to create a second open frequency range, moving the third audio range into the second open frequency range, and providing audio output including the compressed first audio range, the moved second audio range, and the moved third audio range.

Another embodiment relates to a non-transitory computer-readable medium having instructions stored thereon, the instructions forming a program executable by a processing circuit to remap an audio range to a human perceivable range. The instructions include instructions for receiving audio from an audio input and instructions for analyzing the audio to determine a first audio range, a second audio range, and a third audio range. The instructions further include instructions for using frequency compression on the first audio range based on the second audio range and third audio range to create a first open frequency range, instructions for moving the second audio range into the first open frequency range to create a second open frequency range, instructions for moving the third audio range into the second open frequency range, and instructions for providing audio output including the compressed first audio range, the moved second audio range, and the moved third audio range.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
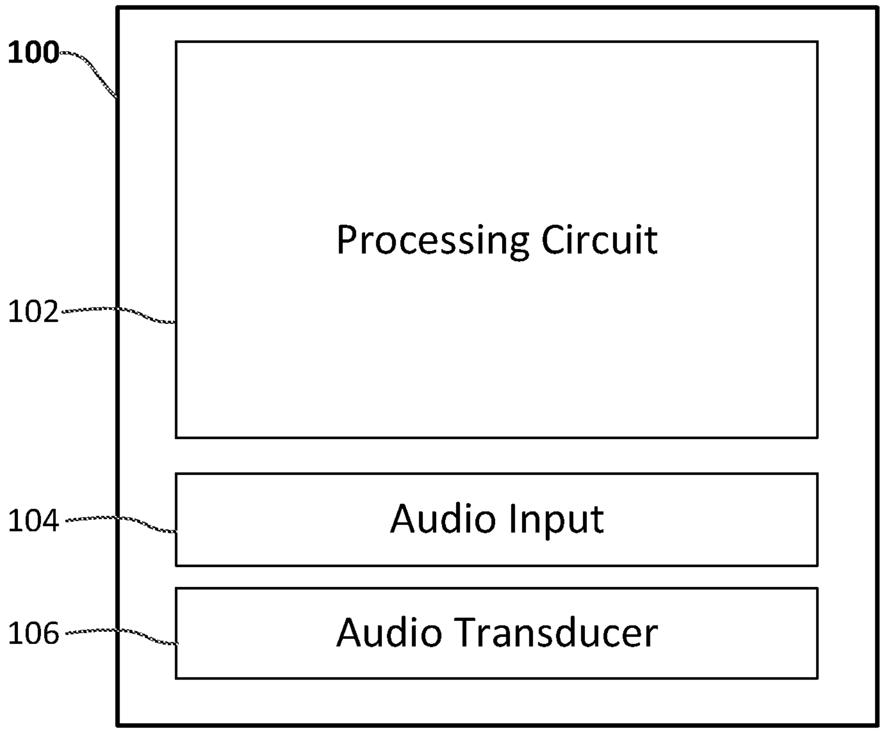
FIG. 1 is a block diagram of a system for remapping an audio range according to an embodiment.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here.

Referring generally to the figures, various embodiments of systems and methods for remapping an audio range to a human perceivable range are shown and described. A user may desire to heard audio ranges outside their normal hearing range. For example, the user may have a hearing impairment in which certain frequency ranges are difficult (or impossible) for the user to hear. As another example, the user may desire to simply hear or accentuate audio ranges that he or she otherwise would not be able to perceive. A device (e.g., a hearing aid, a computing device, a mobile device, etc.) may be used to select and remap a range of audio (i.e. an unperceivable range, an inaudible range, etc.). The desired range may be either too high, too low, an ultrasonic range, an infrasonic range, or a range the user desires to accentuate. The device determines the frequency bandwidth needed to remap the unperceivable range to a perceivable range. In doing so, the device determines a first range within the perceivable range that may be minimized to create free space. The device may minimize the first range using frequency compression and other signal processing algorithms. The device determines a second range within the perceivable range that may be minimized or moved to create additional free space. The device remaps the second range into the free space created by minimizing the first range. The device then remaps the unperceivable range into the residual free space within the perceivable range. Through the application of this process, ranges within the user's perceivable range may be minimized (e.g., frequency compressed) to create free open space bandwidth within the perceivable range without losing significant audio content in the perceivable range. Unperceivable ranges may then be remapped and moved into the open space bandwidth.

In some embodiments, the device further monitors the phase of audio that will be remapped as described above. The device utilizes phase encoding algorithms to adjust the phase of remapped audio that is output in order allow a user to continue to perceive the direction of the source audio.

The described systems herein may be enabled or disabled by a user as the user desires. Additionally, a user may specify preferences in order to set characteristics of the audio ranges the user desires to have remapped. The user may also specify preferences in order to set characteristics of filters or other effects applied to remapped audio ranges. User preferences and settings may be stored in a preference file. Default operating values may also be provided.

Referring to FIG. 1, a block diagram of a system 100 for remapping an audio range is shown. According to an embodiment, system 100 includes a processing circuit 102, an audio input 104 for capturing audio and providing the audio to processing circuit 102, and at least one audio transducer 106 for providing audio output to a user. Audio input 104 includes all components necessary for capturing audio (e.g., a sensor, a microphone). Audio input 104 may provide a single channel, or multiple channels of captured audio. The channels may include the same or different frequency ranges of audio. In an embodiment, audio input 104 further includes analog-to-digital conversion components in order to provide a digital audio data stream. Audio transducer 106 includes components necessary to produce audio (e.g., a speaker, amplifier, volume control, etc.). Audio transducer 106 may include a single speaker, or may include a plurality of speaker components, and may include amplification and volume controlling components. Audio transducer 106 may be capable of producing mono, stereo, and three-dimensional audio effects beyond a left channel and right channel. In an embodiment, Audio transducer 106 includes digital-to-analog conversion components used to convert a digital audio stream to analog audio output. Audio data captured by audio input 104 is provided to processing circuit 102. Processing circuit 102 analyzes input audio in order to remap an audio range to a human perceivable range. It should be understood that although processing circuit 102, audio input 104 and audio transducer 106 are depicted as separate components in FIG. 1, they may be part of a single device.

In an embodiment, system 100 is a hearing aid system, audio input 104 includes a microphone coupled to the hearing aid, and audio transducer 106 is an ear bud speaker of the hearing aid. Processing circuit 102 includes the processing components (e.g., microprocessor, memory, digital signal processing components, etc.) of the hearing aid. In another embodiment, system 100 is a communications device, audio input 104 includes a microphone coupled to the communications device, and audio transducer 106 is set of headphones coupled to the communications device. Processing circuit 102 includes the processing components of the communications device. In another embodiment, system 100 is a mobile device system (e.g., a mobile phone, a laptop computer), audio input 104 includes a microphone built into the mobile device or coupled to the mobile device, and audio transducer 106 is a speaker built into to the mobile device. Processing circuit 102 includes the processing components of the mobile device.

Figure 2:
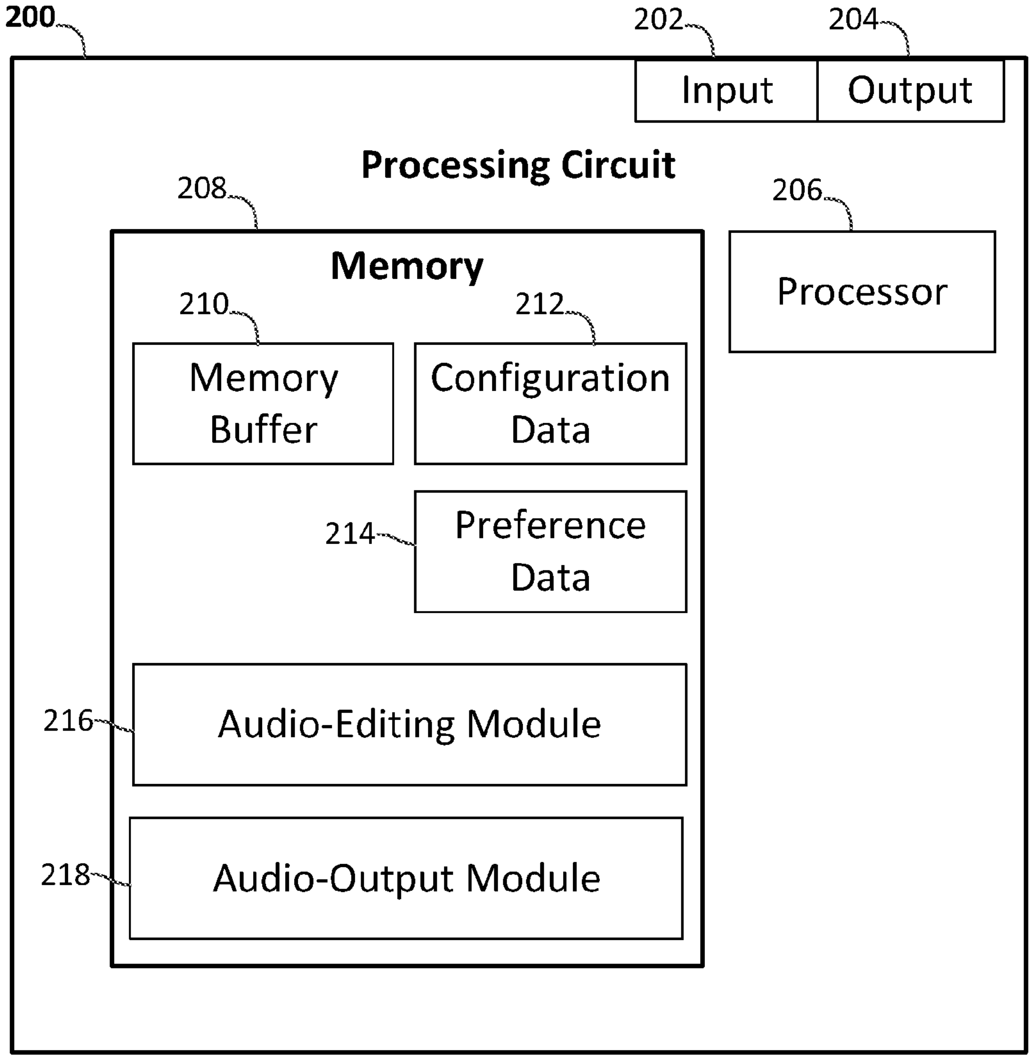
FIG. 2 is a block diagram of a processing circuit according to an embodiment.

Referring to FIG. 2, a detailed block diagram of processing circuit 200 for completing the systems and methods of the present disclosure is shown according to an embodiment. Processing circuit 200 may be processing circuit 102 of FIG. 1. Processing circuit 200 is generally configured to accept input from an outside source (e.g., an audio sensor, a microphone, etc.). Processing circuit 200 is further configured to receive configuration and preference data. Input data may be accepted continuously or periodically. Processing circuit 200 uses the input data to analyze audio and remap a range of audio to a perceivable range. Processing circuit 200 utilizes frequency compression, pitch shifting, and filtering (e.g., high-pass, low-pass, band-pass, notch, etc.) algorithms to create free bandwidth within a user's perceivable range, and moves an unperceivable range or inaudible range, into the free space. Processing circuit 200 may also apply other signal processing functions (e.g., equalization, normalization, volume adjustment, etc.) not directly associated with creating free bandwidth. Based on the bandwidth of the unperceivable range, processing circuit 200 determines the sizes and locations of the ranges within the perceivable range to compress and shift. A number of filters and methods may be used in remapping audio ranges. For example, these may include pitch shifting, frequency compression, a high pass filter, a low pass filter, a band pass filter, a notch filter, etc. Any of the bandwidth creating methods and signal processing functions may be combined or applied individually. Processing circuit 200 outputs an audio stream consisting of the perceivable range of audio and the remapped audio stream without losing significant audio content of the perceivable hearing range. A speaker may then transduce the output audio stream and produce sound for the user.

According to an embodiment, processing circuit 200 includes processor 206. Processor 206 may be implemented as a general-purpose processor, an application specific integrated circuit (ASIC), one or more field programmable gate arrays (FPGAs), a digital-signal-processor (DSP), a group of processing components, or other suitable electronic processing components. Processing circuit 200 also includes memory 208. Memory 208 is one or more devices (e.g., RAM, ROM, Flash Memory, hard disk storage, etc.) for storing data and/or computer code for facilitating the various processes described herein. Memory 208 may be or include non-transient volatile memory or non-volatile memory. Memory 208 may include database components, object code components, script components, or any other type of information structure for supporting the various activities and information structures described herein. Memory 208 may be communicably connected to the processor 206 and include computer code or instructions for executing the processes described herein (e.g., the processes shown in FIGS. 6-10).

Memory 208 includes memory buffer 210. Memory buffer 210 is configured to receive a data stream from a sensor device (e.g. audio input 104, etc.) through input 202. For example, the data may include a real-time audio stream, and audio sensor specification information, etc. The data received through input 202 may be stored in memory buffer 210 until memory buffer 210 is accessed for data by the various modules of memory 208. For example, audio-editing module 216 and audio-output module 218 each can access the data that is stored in memory buffer 210.

Memory 208 further includes configuration data 212. Configuration data 212 includes data relating to processing circuit 200. For example, configuration data 212 may include information relating to interfacing with other components of a device (e.g., a device of system 100 of FIG. 1). This may include the command set needed to interface with a computer system used transfer user settings or otherwise set up the device. This may further include the command set need to generate graphical user interface (GUI) controls and visual information. As another example, configuration data 212 may include the command set needed to interface with communication components (e.g., a universal serial bus (USB) interface, a Wi-Fi interface, etc.). In this manner, processing circuit 200 may format data for output via output 204 to allow a user to use a computing device to configure the systems as described herein. Processing circuit 200 may also format audio data for output via output 204 to allow a speaker to create sound. Configuration data 212 may include information as to how often input should be accepted from an audio input of the device. As another example, configuration data 212 may include default values required to initiate the device and initiate communication with peripheral components. Configuration data 212 further includes data to configure communication between the various components of processing circuit 200.

Processing circuit 200 further includes input 202 and output 204. Input 202 is configured to receive a data stream (e.g., a digital or analog audio stream), configuration information, and preference information. Output 204 is configured to provide an output to a speaker or other components of a computing device as described herein.

Memory 208 further includes modules 216 and 218 for executing the systems and methods described herein. Modules 216 and 218 are configured to receive audio data, configuration information, user preference data, and other data as provided by processing circuit 200. Modules 216 and 218 are generally configured to analyze the audio, determine a range of unperceivable audio to be remapped, apply frequency compression and audio processing to ranges of perceivable audio to create space of open bandwidth, remap the unperceivable audio to the open bandwidth, and output an audio stream consisting of the perceivable and remapped audio. Modules 216 and 218 may be further configured to operate according to a user's preferences. In this manner, certain audio enhancements, modifications, effects, filters, and ranges may be processed according to a user's desires.

Audio-editing module 216 is configured to receive audio data from an audio input (e.g., an audio sensor device, a microphone, etc.). The audio data may be provided through input 202 or through memory buffer 210. The audio data may be digital or analog audio data. In an embodiment where analog audio is provided, processing circuit 200 includes components necessary to convert the analog data into digital data prior to further processing. Audio-editing module 216 scans audio data and analyzes the data. Audio-editing module 216 determines an out-of-band or otherwise unperceivable range of audio. In an embodiment, audio-editing module 216 selects the unperceivable range based on default configuration data. Such configuration data may be supplied be a manufacturer of the device. For example, a device may be preset to remap ultrasonic audio ranges. In another example a device may be preset to remap infrasonic audio ranges. In another example a device may be preset to remap audio ranges based on a particular user's hearing needs. In an embodiment, audio-editing module 216 selects the unperceivable range based on user setting data. A user may provide such setting data when the user initially sets up the device, or the user may later adjust the setting data. For example, a user may desire to have a certain bass frequency range accentuated. In determining and shifting audio ranges, audio-editing module 216 may make use of machine learning, artificial intelligence, interactions with databases and database table lookups, pattern recognition and logging, intelligent control, neural networks, fuzzy logic, etc. Audio-editing module 216 provides audio data to audio-output module 218, which formats and further processes the audio data for output via an audio transducer.

In an embodiment, audio-editing module 216 receives an audio stream from a microphone, and remaps an out-of-band range (e.g., an ultrasonic band, a band outside the high spectrum of the user's range, a range selected to be emphasized, etc.). Audio-editing module 216 determines the bandwidth used by the out-of-band range λ3. Audio-editing module 216 determines a first range λ1 within the perceivable range, and applies frequency compression processing to λ1 to create λ1' and a first open range of bandwidth. Range λ1' includes the same general audio content as λ1, but since it has been frequency compressed, it uses a smaller overall bandwidth. In one embodiment range λ1 is selected based on content (or lack of content) in the range. Content may include raw audio signal content, or audio-editing module 216 may analyze the signal to determine audio informational content. For example, audio-editing module 216 may detect that there is a lack of significant audio at range λ1. Audio-editing module 216 further determines a second range λ2 within the perceivable range. Range λ2 may or may not overlap range λ1'. Audio-editing module 216 moves (and shifts) the audio content corresponding to range λ2 into the first open range, thereby creating a second open range of bandwidth. Audio-editing module 216 may apply frequency compression processing to range λ2. Audio-editing module 216 then moves (and shifts) the audio content corresponding to range λ3 into the second open range of bandwidth. After remapping the audio as described above, the perceivable range of audio comprises range λ1', range λ2, range λ3, and any ranges of audio that we left unaltered. Audio-editing module 216 then provides the audio stream to audio-output module 218.

It should be understood that the following scenarios are provided for illustrative purposes only, and are not intended to limit the scope of this disclosure. Any audio ranges may be selected and used for remapping. Furthermore, more than one set of ranges λ1, λ2, and λ3 may be selected and processed at any time, allowing for the remapping of multiple ranges, either simultaneously or sequentially. Any of ranges λ1, λ2, and λ3 may correspond to audible frequency ranges, attenuated frequency ranges, inaudible frequency ranges, etc.

As an example, a user may have lost his or her ability to hear audio within the 12-15 kHz range. The user creates a user setting corresponding to remapping the 12-15 kHz range. Audio-editing module 216 may select the 0-8 kHz range and process that range using frequency compression, thereby condensing the 0-8 kHz content into the 0-7 kHz range and leaving the 7-8 kHz range open. Audio-editing module 216 module may then select the 8-10 kHz range and apply frequency compression condense the 8-10 kHz content into the 8-9 kHz range, thereby leaving the 9-10 kHz range open. Audio-editing module then moves the 8-9 kHz range into the open 7-8 kHz range, leaving 8-10 kHz open. Audio-editing module 216 then applies frequency compression to the 12-15 kHz range, and moves the condensed range into the open 8-10 kHz range. Audio-editing module 216 provides the audio stream to audio-output module 218.

As another example, a user may have lost his or her ability to hear audio within the 500 Hz-1 kHz range. Audio-editing module 216 may select the 2-8 kHz range and process that range using frequency compression, thereby condensing the 2-8 kHz content and shifting it into the 3-8 kHz range and leaving the 2-3 kHz range open. Audio-editing module 216 module may then select the 1-2 kHz range and shift the 1-2 kHz content into the 2-3 kHz range, thereby leaving the 1-2 kHz range open. Audio-editing module 216 then shifts the 500 Hz-1 kHz range into the open 1-1.5 kHz range. In one embodiment, audio-editing module 216 applies signal processing to multiply the audio of the 500 Hz-1 kHz range such that it fills the entire 1-2 kHz open range. Audio-editing module 216 provides the audio stream to audio-output module 218.

As another example, a user may have desire to have audio within audible 9-10 kHz range accentuated. Audio-editing module 216 may select the 0-8 kHz range and process that range using frequency compression, thereby condensing the 0-8 kHz content into the 0-7 kHz range and leaving the 7-8 kHz range open. Audio-editing module 216 module may then select the 8-9 kHz range and apply frequency compression to condense the 8-9 kHz content and shift it into the 7-7.5 kHz range, thereby leaving the 7.5-9 kHz range open. Audio-editing module may then move the 9-10 kHz range into the open 7.5-8.5 kHz range. Audio-editing module may increase the volume or apply a filter to the 7.5-8.5 kHz range. In one embodiment, the filter includes equalization. In another embodiment, the filter includes a high pass filter. In another embodiment, the filter includes a low pass filter. In another embodiment, the filter includes a band pass filter. In another embodiment, the filter includes normalization. In another embodiment, the filter includes an audio intensity adjustment. As another example, audio-editing module 216 may filter a range of audio in order to create open space in which to shift a second range.

As another example, a user may have desire to hear or clarify audio of a range that is within an attenuated range or that is typically outside a normal hearing range. The attenuated range, desired range to hear, and normal hearing range may be specified by a user's settings (e.g., stored in preference data 214), or be specified as a default value (e.g., stored in configuration data 212). For example, the user may desire to hear ultrasonic audio from 40-41 kHz. Audio-editing module 216 may determine that there is little or no content within the 0-1 kHz range and filter it (e.g., via a band pass filter) from the source audio, thereby removing the audio of the 0-1 kHz range, and leaving the 0-1 kHz open. Audio-editing module 216 module may then apply compression to the 0-9 kHz range, thereby condensing the 0-9 kHz range it into the 0-8 kHz range, leaving 8-9 kHz open. Audio-editing module 216 module may then shift the ultrasonic 40-41 kHz range into the open 8-9 kHz range.

In an embodiment, audio-editing module 216 selects the ranges λ1 and λ2 based on the spectral content of audio within the ranges during a certain time frame. For example, if the previous 100 milliseconds of audio within a certain range λ1 indicates silence (or minimal audio content), audio-editing module 216 may select the bandwidth corresponding to the silence as λ1. As another example, audio-editing module 216 may monitor an audio stream for an extended period of time (e.g., 10 seconds, a minute, 5 minutes, an hour, etc.). Audio-editing module 216 may average ranges of audio or monitor actual content of ranges to determine silence or minimal audio content. In another embodiment, audio-editing module 216 selects the ranges λ1, λ2, and λ3 based solely on configuration data or user settings. In this manner, ranges λ1, λ2, and λ3 are statically selected, regardless of the spectral content in any of the ranges. In another embodiment, audio-editing module 216 selects the ranges λ1, λ2, and λ3 dynamically. In this manner, the boundaries of ranges λ1, λ2, and λ3 may be expanded, decreased, or otherwise adjusted based on a condition. For example, ranges λ1, λ2, and λ3 may be selected based on a schedule, timing requirements, a user action, background noise or an environmental condition, etc. In another embodiment, audio-editing module 216 selects the ranges λ1, λ2, and λ3 based on learned information or historical information related to an audio range. For example, audio-editing module 216 may maintain a database or history of characteristics of certain audio ranges, and may apply artificial intelligence/machine learning algorithms to determine characteristics of audio ranges. In another embodiment, audio-editing module 216 selects the ranges λ1, λ2, and λ3 based on environmental or external information indicative of audio that is received. For example, audio-editing module 216 may receive location information, time-of-day information, historical data, etc. Based on this data information, audio-editing module 216 may determine informational content of the audio signal, and may determine which ranges λ1, λ2, and λ3 may be best suited for manipulation as described herein. For example, audio-editing module 216 may select λ1 and λ2 based on received location information that indicates a user is in a library, where λ1 and λ2 are ranges that typically have minimal audio content in a library setting. As another example, audio-editing module 216 may determine a range λ3 to accentuate based on information indicating it is nighttime or daytime, etc.

Audio-output module 218 is configured to receive audio data from audio-editing module 216, and format the audio data for output to an audio transducer via output 204. In an embodiment, audio-output module 218 coverts digital audio to an analog audio signal, and provides the analog signal through output 204. In an embodiment where a digital-to-analog converter is separate from processing circuit 200 (e.g., where the audio transducer includes digital-to-analog conversion components), audio-output module 218 may route the analog audio signal through output 204. Audio-output module 218 may also mix audio signals prior to outputting the signal. Mixing may be based on the type or specifications of the audio transducer in use. For example, audio-output module 218 may apply one mixing algorithm when the audio is output to a single ear bud, and audio-output module 218 may apply a different mixing algorithm if the audio is output to stereo headphones. Audio-output module 218 may have a single channel of output, or may have multiple channels. Audio-output module 218 may handle all audio interleaving.

In an embodiment, audio-output module 218 applies a filter to an audio stream received from audio-editing module 216. For example, this may include normalizing the audio stream prior to outputting the audio. As another example, this may include equalizing the audio stream prior to outputting the audio. Filters may be applied according to user settings. For example, a user may desire a certain EQ setting and normalization filter to be applied to any remapped audio in order to bring the average or peak amplitude of the audio signal within a specified level.

In an embodiment, audio is output to a stereo transducer (e.g., headphones). In such an embodiment, audio-editing module 216 may process left and right channels of audio individually. Audio-editing module 216 may apply the same or different processing to the left and right channels. Any of the processing discussed herein may be applied to the left or right channels. For example, a source audio input may provide multiple channels of audio (e.g., a left and right channel, channels for multiple frequency ranges, etc.). The channels may include identical or different frequency ranges of audio. Audio-editing module 216 may compress and shift the same ranges in both the left and right channel audio. As another example, audio-editing module 216 may compress and shift ranges in the left channel that are different from compressed and shifted ranges in the right channel. In another embodiment, audio-editing module 216 may process either the left or right channel, and allow the unprocessed channel to pass through. For example, audio-editing module 216 may apply compression and shifting to a range in the left range to be output (via audio-output module 218). Audio-editing module 216 may concurrently pass through the original source audio of the left channel to be output (via audio-output module 218) as the right channel. In this manner, a user may be able to hear both the processed audio (e.g., output as the left channel) and unprocessed audio (e.g., output as the right channel). Audio-editing module 216 may transform a stereo signal into a mono signal before or after any processing. In another embodiment, audio-editing module 216 may generate audio to be output as the left or right channel. The generated audio mayor may not be based on the source audio stream, and may be formatted for output by audio-output module 218.

In one embodiment, audio-output module 218 outputs left and right channels an audio stream into, and encodes the left and right channels with certain phase encodings. The phase encodings may be determined according to a detected phase of the channels in the initial source audio stream, before the channel audio streams are edited by audio-editing module 216. In one embodiment, audio-editing module 216 provides the phase information to audio-output module 218. In another embodiment, audio-output module 218 accesses the source audio stream channels directly and detects phase information. Through the use of phase encoding, audio-output module 218 may output audio to a user including directional information of the audio. This enables a user to be able to detect the spatial location of the audio source.

In another embodiment where the audio is output to a stereo transducer (e.g., headphones) audio-output module 218 may split the audio stream into left and right channels, and encode the left and right channels with certain phase encodings. The phase encodings may be determined according to a user setting or a default configuration. For example, a user may enable a setting to balance the output audio. In this scenario, if audio-editing module 216 provides an audio stream including a range λ3 that is only present in a left-channel (or has a phase that indicates range λ3 is heavily present on the left), audio-output module 218 may adjust the phase of the output audio to create a more balanced and overall clear sound (e.g., adjusting the phase to balance λ3 between the left and right channels, etc.). It should be understood, that any of the filters or audio adjustments discussed herein may be combined and generated separately or at the same time.

Referring generally to FIGS. 3-10, various schematic diagrams and processes are shown and described that may be implemented using the systems and methods described herein. The schematic diagrams and processes may be implemented using the system 100 of FIG. 1 and processing circuit 200 of FIG. 2.

Figure 3:
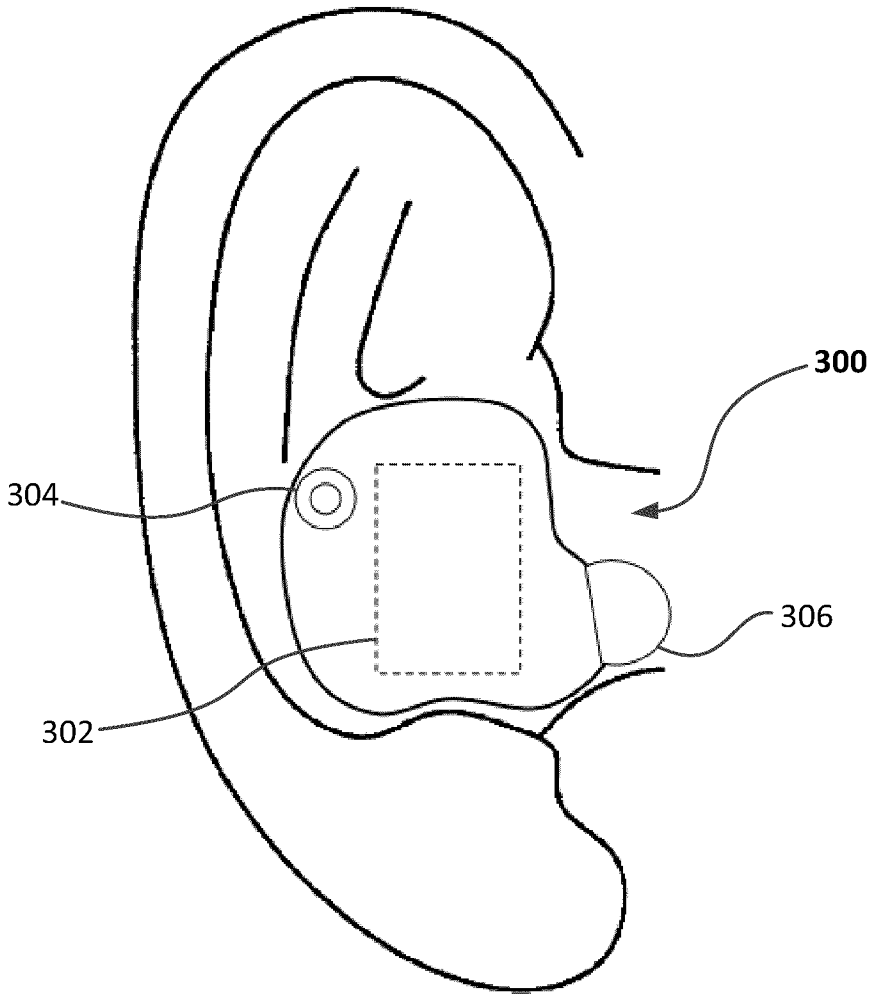
FIG. 3 is a schematic diagram of a system for remapping an audio range according to an embodiment.

Referring to FIG. 3, a schematic diagram of device 300 for remapping an audio range to a human perceivable range is shown according to an embodiment. Device 300 is shown as an in-ear hearing aid including an ear bud. Processing circuit 302 includes the internal processing components of the hearing aid. Audio input 304 includes a microphone coupled to the hearing aid. Audio transducer 306 is the ear bud of the hearing aid. Processing circuit 302 contains modules and components as describe above. While FIG. 3 only shows a single microphone as audio input 304, it should be understood that audio input 304 may include multiple microphones. In one embodiment, device 300 is configured to fit within a user's ear canal.

Figure 4:
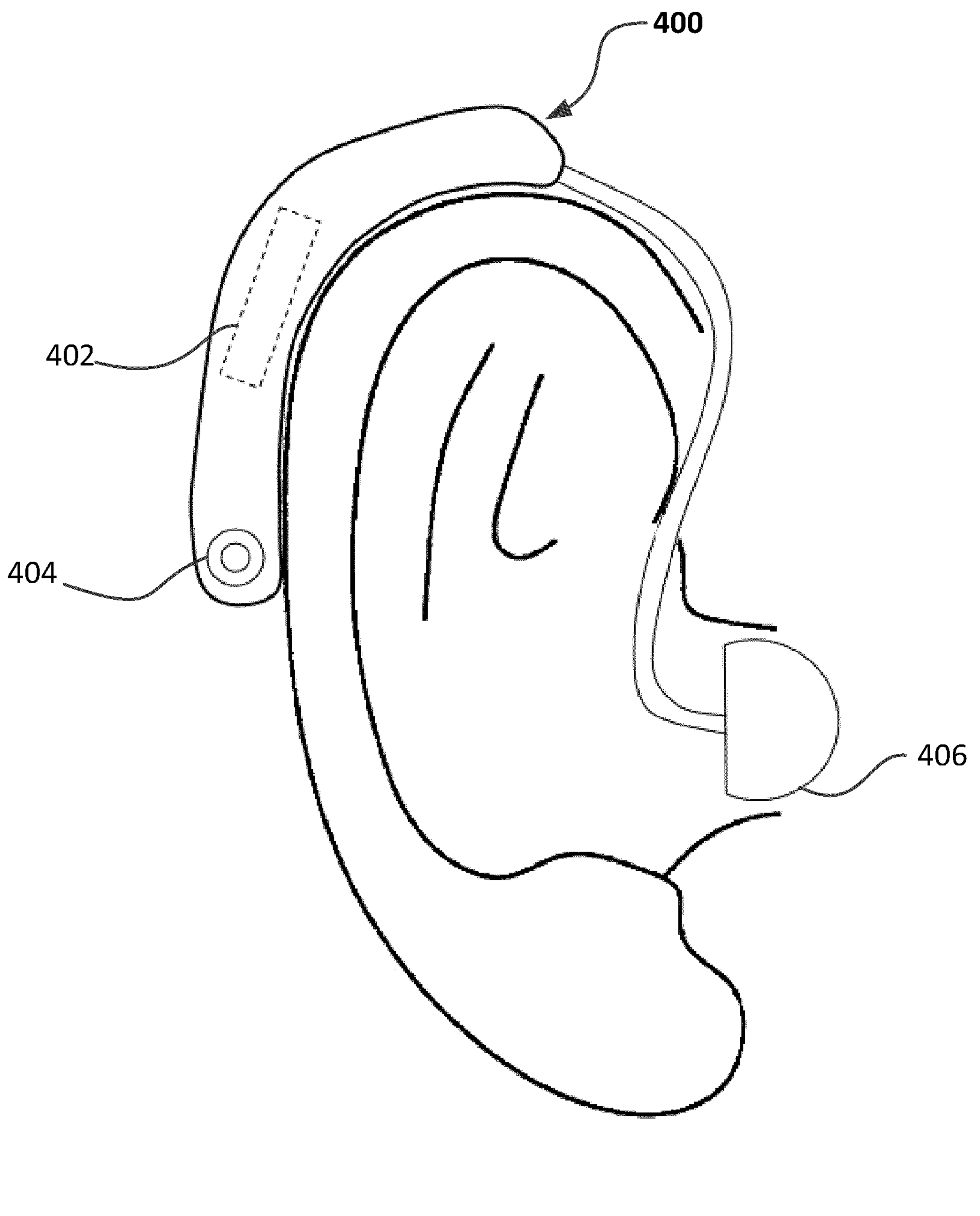
FIG. 4 is a schematic diagram of a system for remapping an audio range according to an embodiment.

Referring to FIG. 4, a schematic diagram of device 400 for remapping an audio range to a human perceivable range is shown according to an embodiment. Device 400 is shown as a behind-the-ear hearing aid with an earpiece that is connected to device 400 by tubing. Processing circuit 402 includes the internal processing components of the hearing aid. Audio input 404 includes a microphone coupled to the hearing aid. Audio transducer 406 is the earpiece system of the hearing aid. Audio transducer 406, located within the hearing aid, generates sound output, which is transferred through a tube to the earpiece portion. Processing circuit 402 contains modules and components as described above. While FIG. 4 only shows a single microphone as audio input 404, it should be understood that audio input 404 may include multiple microphones.

Figure 5:
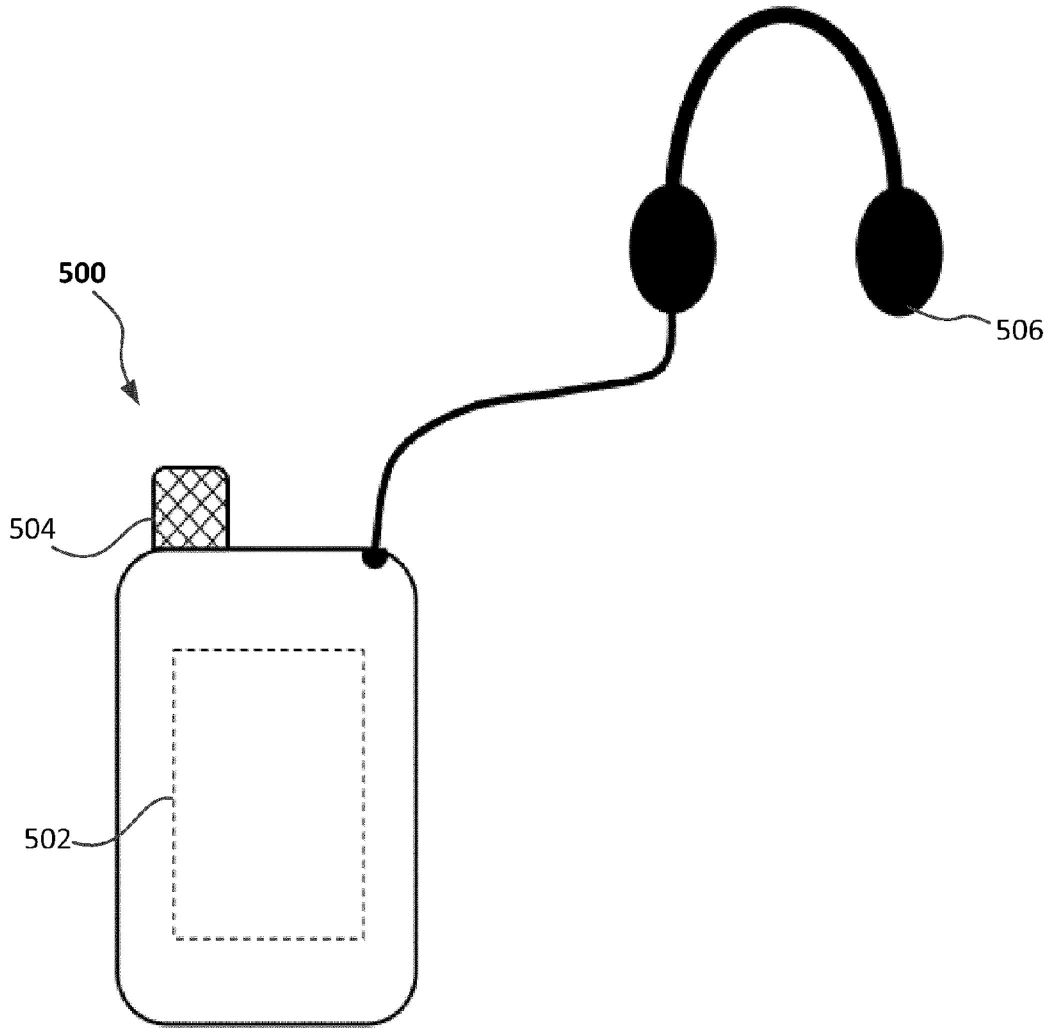
FIG. 5 is a schematic diagram of a system for remapping an audio range according to an embodiment.

Referring to FIG. 5, a schematic diagram of device 500 for remapping an audio range to a human perceivable range is shown according to an embodiment. Device 500 is shown as a hearing device connected to stereo headphones. Processing circuit 502 includes the internal processing components of the hearing device. Audio input 504 includes a microphone coupled to the hearing device. Audio transducer 506 includes headphones coupled to the hearing device. Processing circuit 502 contains modules and components as describe above. While FIG. 5 only shows a single microphone as audio input 504, it should be understood that audio input 504 may include multiple microphones. Additional embodiments are also envisioned by the scope of the present application. In one embodiment, device 500 may be a mobile phone. In another embodiment, device 500 may be a laptop.

Figure 6:
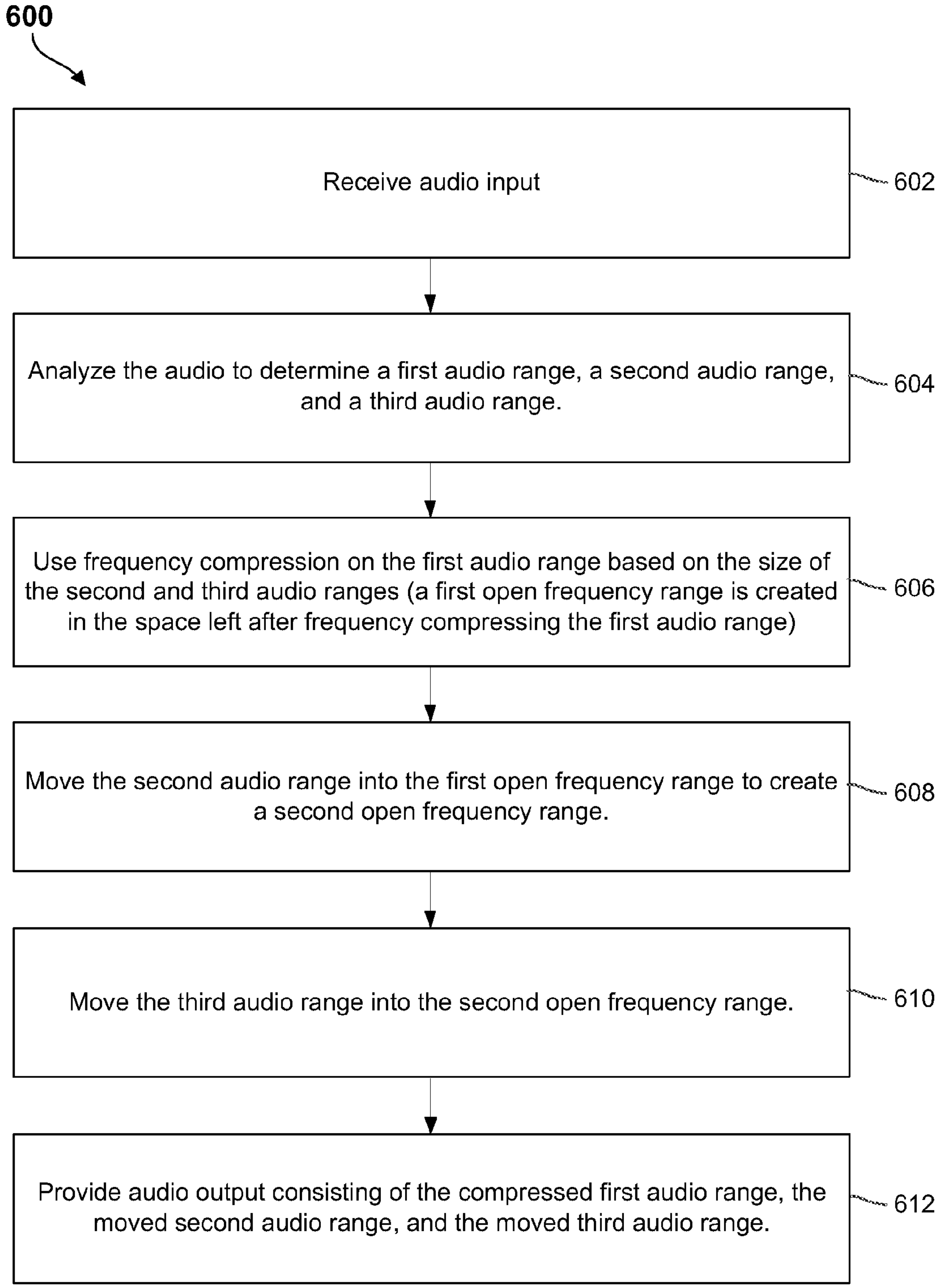
FIG. 6 is a flowchart of a process for remapping an audio range according to an embodiment.

Referring to FIG. 6, a flow diagram of a process 600 for remapping an audio range to a human perceivable range, is shown, according to an embodiment. In alternative embodiments, fewer, additional, and/or different steps may be performed. Also, the use of a flow diagram is not meant to be limiting with respect to the order of steps performed. Process 600 includes: receive audio input (602) (e.g., from an audio sensor, etc.), analyze the audio to determine a first audio range, a second audio range, and a third audio range (604), use frequency compression on the first audio range based on the size of the second and third audio ranges (a first open frequency range is created in the space left after frequency compressing the first audio range) (606), move the second audio range into the first open frequency range to create a second open frequency range (608), move the third audio range into the second open frequency range (610), and provide audio output consisting of the compressed first audio range, the moved second audio range, and the moved third audio range (612).

Figure 7:
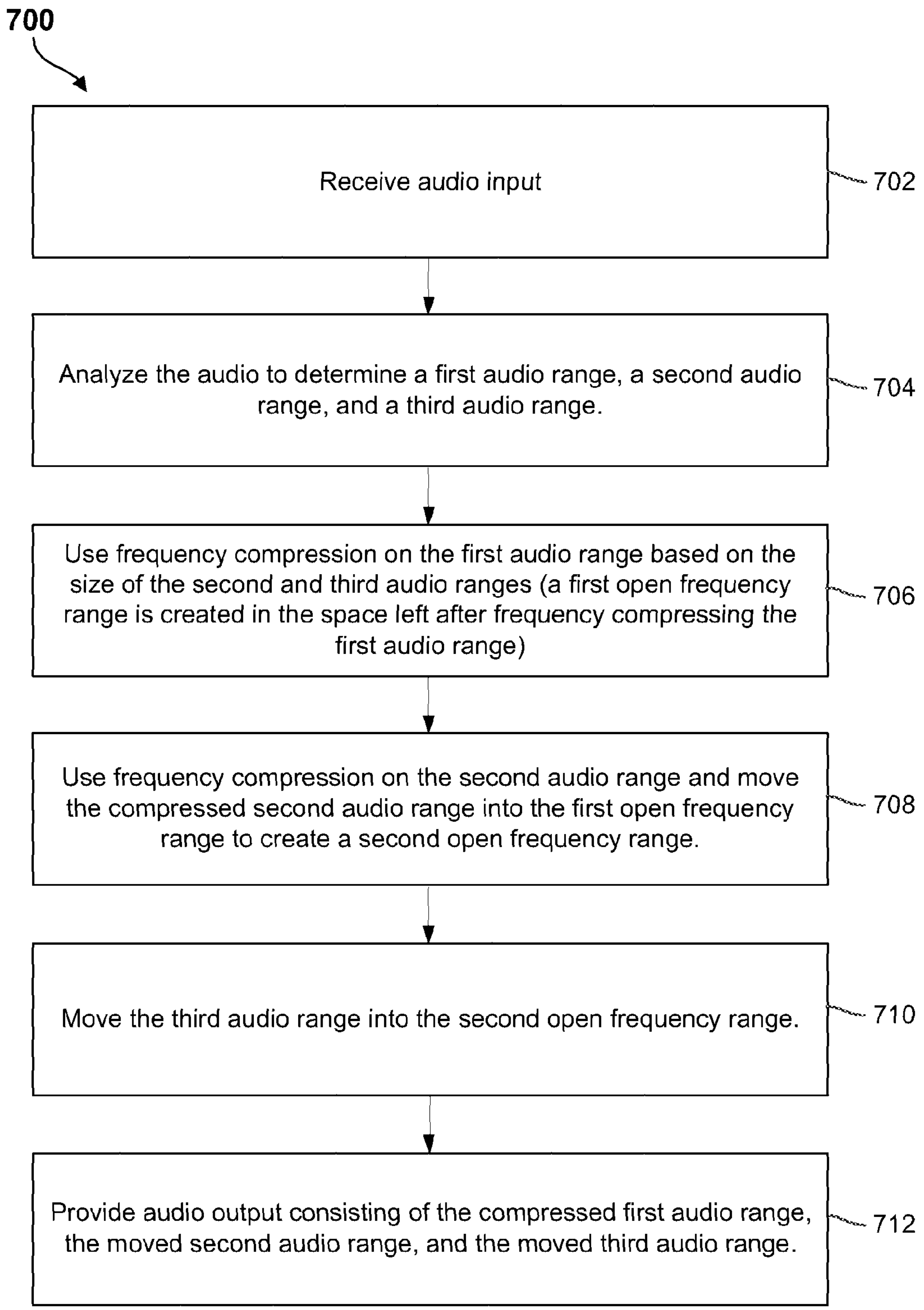
FIG. 7 is a flowchart of a process for remapping an audio range according to an embodiment.

Referring to FIG. 7, a flow diagram of a process 700 for remapping an audio range to a human perceivable range, is shown, according to an embodiment. In alternative embodiments, fewer, additional, and/or different steps may be performed. Also, the use of a flow diagram is not meant to be limiting with respect to the order of steps performed. Process 700 includes: receive audio input (702), analyze the audio to determine a first audio range, a second audio range, and a third audio range (704), use frequency compression on the first audio range based on the size of the second and third audio ranges (a first open frequency range is created in the space left after frequency compressing the first audio range) (706), use frequency compression on the second audio range and move the compressed second audio range into the first open frequency range to create a second open frequency range (708), move the third audio range into the second open frequency range (710), and provide audio output consisting of the compressed first audio range, the moved second audio range, and the moved third audio range (712).

Figure 8:
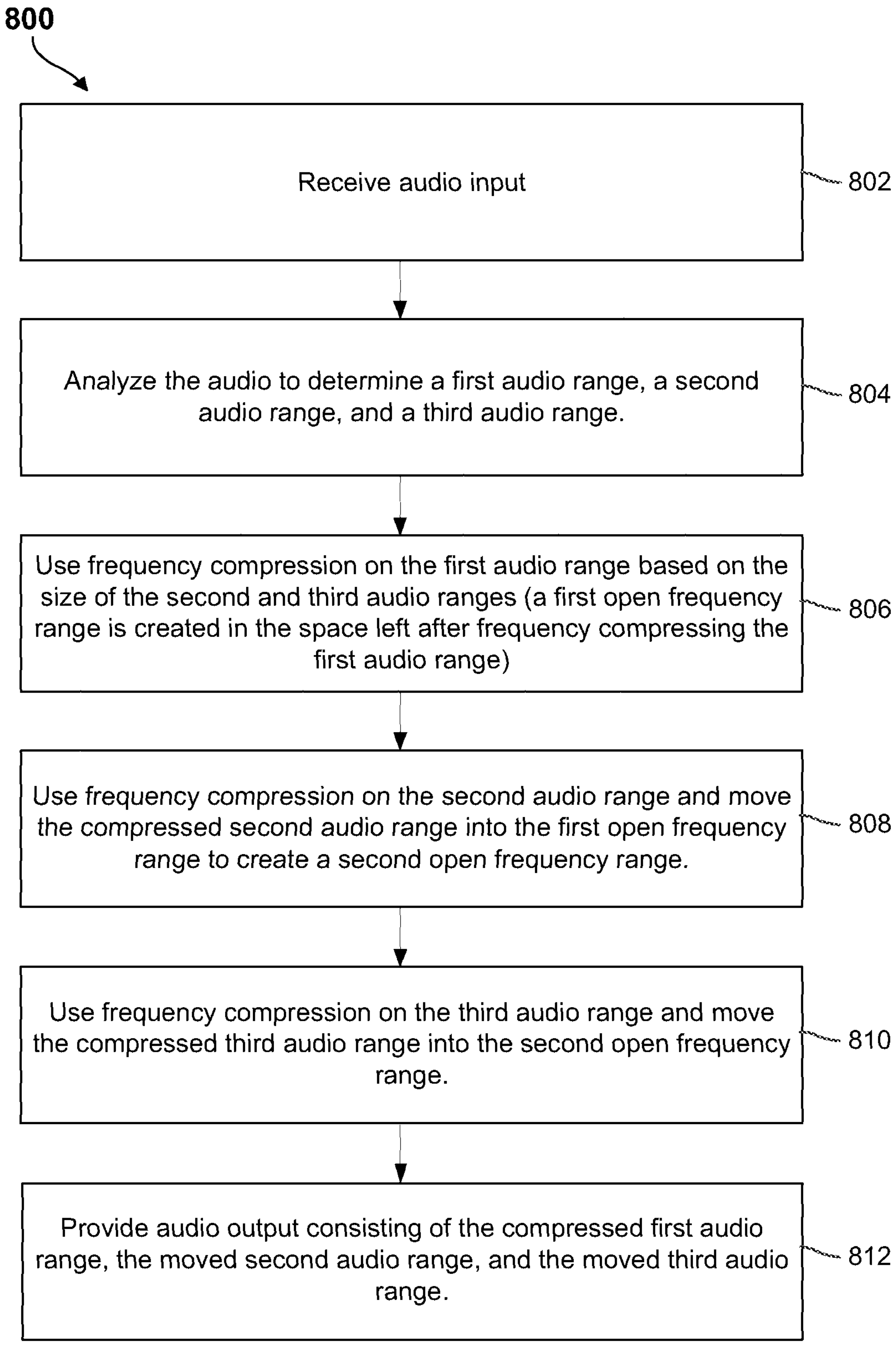
FIG. 8 is a flowchart of a process for remapping an audio range according to an embodiment.

Referring to FIG. 8, a flow diagram of a process 800 for remapping an audio range to a human perceivable range, is shown, according to an embodiment. In alternative embodiments, fewer, additional, and/or different steps may be performed. Also, the use of a flow diagram is not meant to be limiting with respect to the order of steps performed. Process

800 includes: receive audio input (802), analyze the audio to determine a first audio range, a second audio range, and a third audio range (804), use frequency compression on the first audio range based on the size of the second and third audio ranges (a first open frequency range is created in the space left after frequency compressing the first audio range) (806), use frequency compression on the second audio range and move the compressed second audio range into the first open frequency range to create a second open frequency range (808), use frequency compression on the third audio range and move the compressed third audio range into the second open frequency range (810), and provide audio output consisting of the compressed first audio range, the moved second audio range, and the moved third audio range (812).

Figure 9:
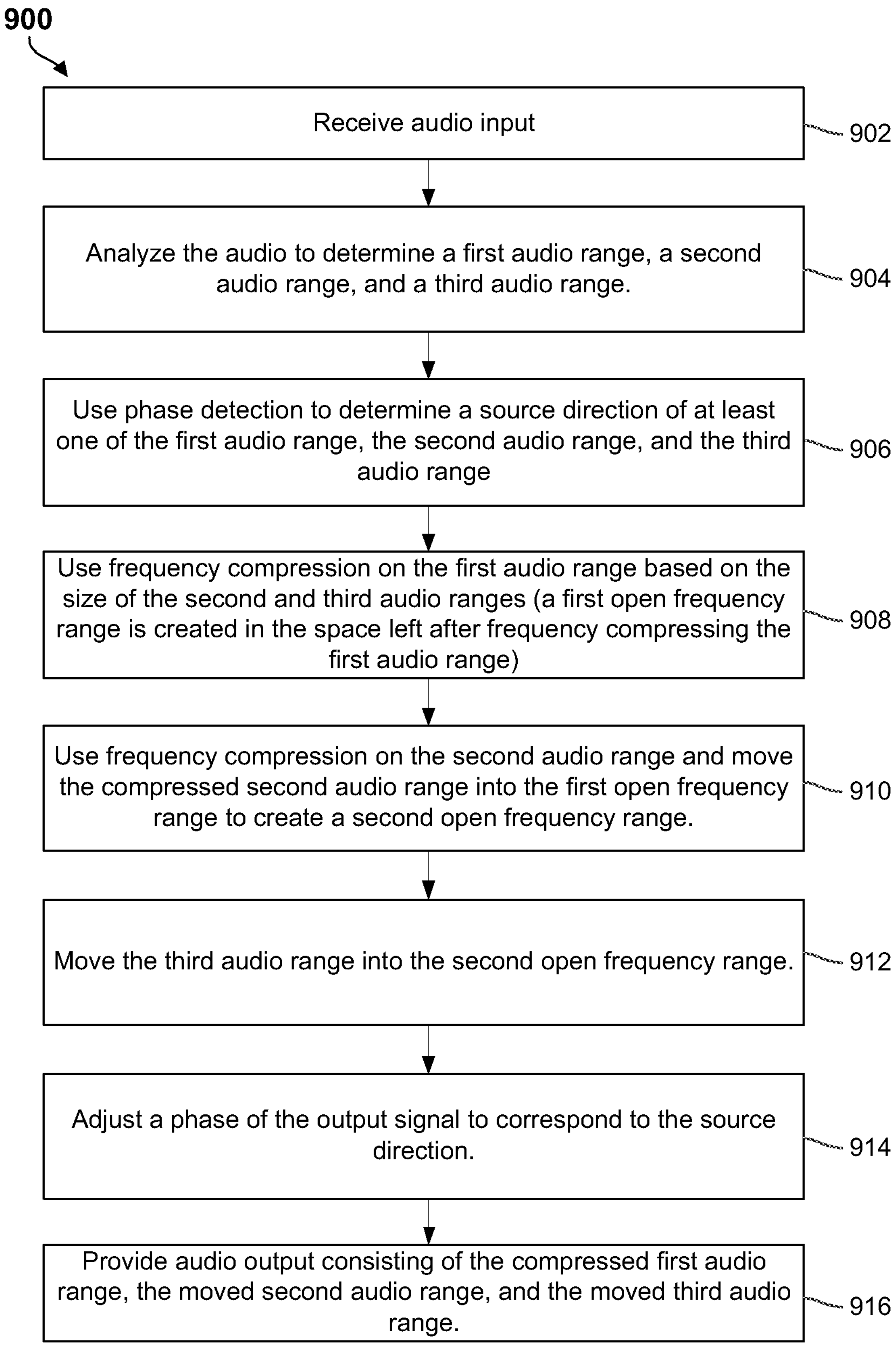
FIG. 9 is a flowchart of a process for remapping an audio range according to an embodiment.

Referring to FIG. 9, a flow diagram of a process 900 for remapping an audio range to a human perceivable range, is shown, according to an embodiment. In alternative embodiments, fewer, additional, and/or different steps may be performed. Also, the use of a flow diagram is not meant to be limiting with respect to the order of steps performed. Process 900 includes: receive audio input (902), analyze the audio to determine a first audio range, a second audio range, and a third audio range (904), use phase detection to determine a source direction of at least one of the first audio range, the second audio range, and the third audio range (906), use frequency compression on the first audio range based on the size of the second and third audio ranges (a first open frequency range is created in the space left after frequency compressing the first audio range) (908), use frequency compression on the second audio range and move the compressed second audio range into the first open frequency range to create a second open frequency range (910), move the third audio range into the second open frequency range (912), adjust a phase of the output signal to correspond to the source direction (914), and provide audio output consisting of the compressed first audio range, the moved second audio range, and the moved third audio range (916).

Figure 10:
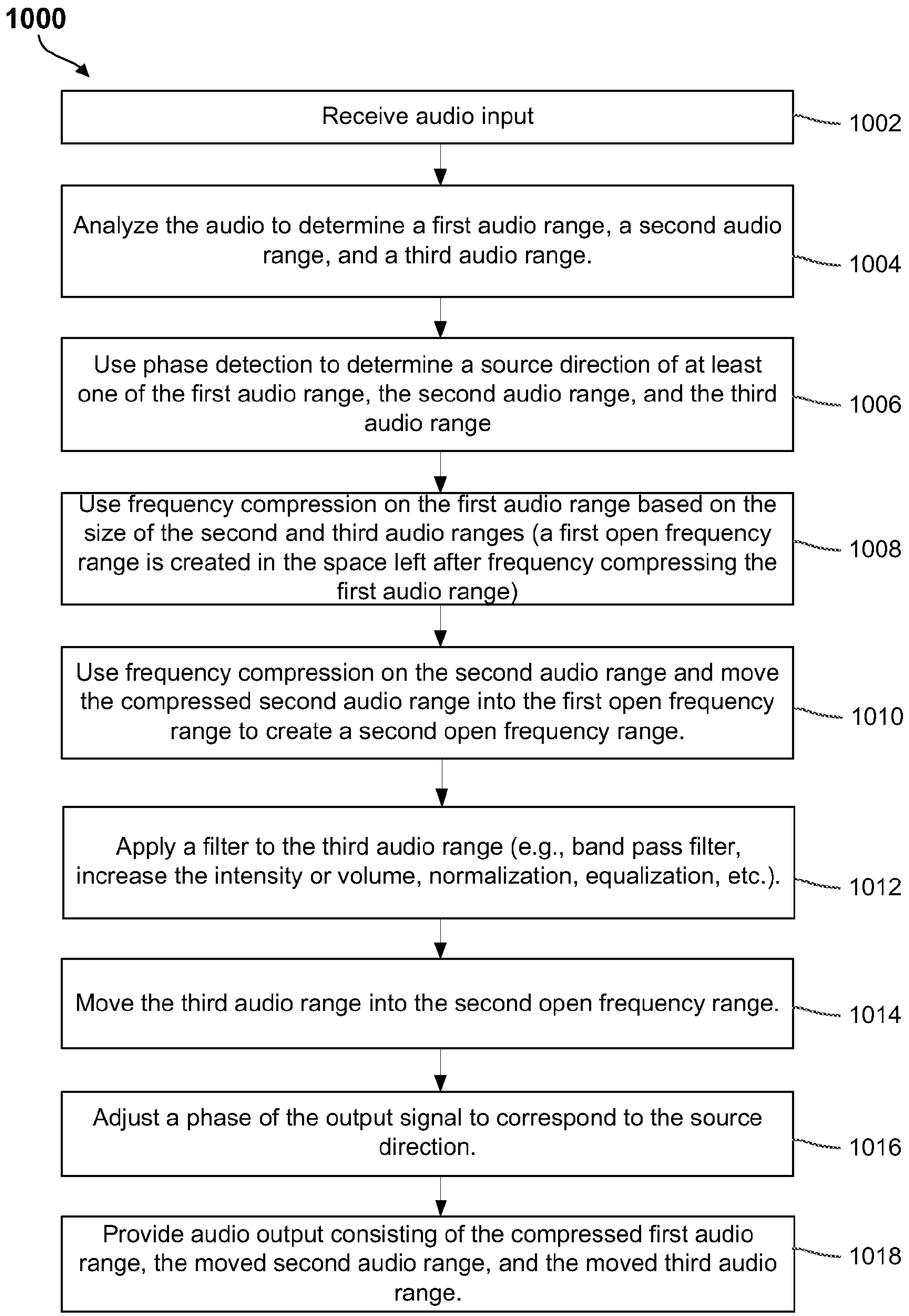
FIG. 10 is a flowchart of a process for remapping an audio range according to an embodiment.

Referring to FIG. 10, a flow diagram of a process 1000 for remapping an audio range to a human perceivable range, is shown, according to an embodiment. In alternative embodiments, fewer, additional, and/or different steps may be performed. Also, the use of a flow diagram is not meant to be limiting with respect to the order of steps performed. Process 1000 includes: receive audio input (1002), analyze the audio to determine a first audio range, a second audio range, and a third audio range (1004), use phase detection to determine a source direction of at least one of the first audio range, the second audio range, and the third audio range (1006), use frequency compression on the first audio range based on the size of the second and third audio ranges (a first open frequency range is created in the space left after frequency compressing the first audio range) (1008), use frequency compression on the second audio range and move the compressed second audio range into the first open frequency range to create a second open frequency range (1010), apply a filter to the third audio range (e.g., band pass filter, increase the intensity or volume, normalization, equalization, etc.) (1012), move the third audio range into the second open frequency range (1014), adjust a phase of the output signal to correspond to the source direction (1016), and provide audio output consisting of the compressed first audio range, the moved second audio range, and the moved third audio range (1018).

The construction and arrangement of the systems and methods as shown in the various embodiments are illustrative only. Although only a few embodiments have been described in detail in this disclosure, many modifications are possible (e.g., variations in sizes, dimensions, structures, shapes and proportions of the various elements, values of parameters, mounting arrangements, use of materials, colors, orientations, etc.). For example, the position of elements may be reversed or otherwise varied and the nature or number of discrete elements or positions may be altered or varied. Accordingly, all such modifications are intended to be included within the scope of the present disclosure. The order or sequence of any process or method steps may be varied or re-sequenced according to alternative embodiments. Other substitutions, modifications, changes, and omissions may be made in the design, operating conditions and arrangement of the embodiments without departing from the scope of the present disclosure.

The present disclosure contemplates methods, systems and program products on any machine-readable media for accomplishing various operations. The embodiments of the present disclosure may be implemented using existing computer processors, or by a special purpose computer processor for an appropriate system, incorporated for this or another purpose, or by a hardwired system. Embodiments within the scope of the present disclosure include program products comprising machine-readable media for carrying or having machine-executable instructions or data structures stored thereon. Such machine-readable media can be any available media that can be accessed by a general purpose or special purpose computer or other machine with a processor. By way of example, such machine-readable media can comprise RAM, ROM, EPROM, EEPROM, CD-ROM or other optical disk storage, magnetic disk storage or other magnetic storage devices, or any other medium which can be used to carry or store desired program code in the form of machine-executable instructions or data structures and which can be accessed by a general purpose or special purpose computer or other machine with a processor. When information is transferred or provided over a network or another communications connection (either hardwired, wireless, or a combination of hardwired or wireless) to a machine, the machine properly views the connection as a machine-readable medium. Thus, any such connection is properly termed a machine-readable medium. Combinations of the above are also included within the scope of machine-readable media. Machine-executable instructions include, for example, instructions and data which cause a general purpose computer, special purpose computer, or special purpose processing machines to perform a certain function or group of functions.

Although the figures may show a specific order of method steps, the order of the steps may differ from what is depicted. Also two or more steps may be performed concurrently or with partial concurrence. Such variation will depend on the software and hardware systems chosen and on designer choice. All such variations are within the scope of the disclosure. Likewise, software implementations could be accomplished with standard programming techniques with rule-based logic and other logic to accomplish the various connection steps, processing steps, comparison steps and decision steps.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A system for remapping an audio range to a human perceivable range, comprising:

an audio transducer configured to output audio; and a processing circuit configured to:

receive audio from an audio input;

analyze the audio to determine a first audio range, a second audio range, and a third audio range, wherein one or more of the first, second, and third audio ranges are determined based on analyzing an audio range of the audio over a period of time;

use frequency compression on the first audio range, based on the bandwidths of the second audio range and third audio range, to create a first open frequency range, wherein the first open frequency range is within the first audio range;

move the second audio range into the first open frequency range to create a second open frequency range;

move the third audio range into the second open frequency range; and provide an output signal to the audio transducer, wherein the output signal includes the compressed first audio range, the moved second audio range, and the moved third audio range.

2. The system of claim 1, wherein moving the second audio range includes using frequency compression on the second audio range.

3. The system of claim 1, wherein moving the third audio range includes using frequency compression on the third audio range.

4. The system of claim 1, wherein the third audio range corresponds to an inaudible frequency range.

5. The system of claim 1, wherein the third audio range corresponds to an attenuated frequency range.

6. The system of claim 1, wherein the processing circuit is further configured apply a filter to at least one of the first audio range, the second audio range, and the third audio range.

7. The system of claim 6, wherein the filter includes at least one of an audio intensity filter, a volume level filter, a band pass filter, a high pass filter, a low pass filter, a normalization filter, and an equalization filter.

8. The system of claim 1, wherein one or more of the audio ranges are based on a user setting.

9. The system of claim 1, wherein analyzing the audio range includes determining informational content of the audio range.

10. The system of claim 1, wherein analyzing the audio range includes determining raw audio signal content of the audio range.

11. The system of claim 1, wherein one or more of the audio ranges are based on external information indicative of audio to be received, and wherein the external information includes at least one of location information, time of day information, and historical data.

12. The system of claim 1, wherein using the frequency compression on the first audio range is time dependent.

13. The system of claim 1, wherein using the frequency compression on the first audio range is time independent.

14. The system of claim 1, wherein moving the second audio range is time dependent.

15. The system of claim 1, wherein moving the second audio range is time independent.

16. The system of claim 1, wherein the audio input includes multiple channels.

17. The system of claim 16, wherein the processing circuit is further configured to process a first channel of the audio input separately from a second channel of the audio input.

18. The system of claim 16, wherein a frequency range of the audio input for a first channel is different than a frequency range of the audio input for a second channel.

19. The system of claim 1, wherein the processing circuit is further configured to:

use phase detection to determine a source direction of at least one of the first audio range, the second audio range, and the third audio range; and adjust a phase of the output signal to correspond to the source direction.

20. A method for remapping an audio range to a human perceivable range, comprising:

receiving audio from an audio input;

analyzing the audio to determine a first audio range, a second audio range, and a third audio range, wherein one or more of the first, second, and third audio ranges are determined based on analyzing an audio range of the audio over a period of time, and wherein analyzing the audio range includes determining informational content of the audio range, wherein determining informational content of the audio range includes determining at least one of a lack of significant audio over an audio range, phase information, and directional information;

using frequency compression on the first audio range based on the bandwidths of the second audio range and third audio range to create a first open frequency range, wherein the first open frequency range is within the first audio range;

moving the second audio range into the first open frequency range to create a second open frequency range;

moving the third audio range into the second open frequency range; and providing audio output including the compressed first audio range, the moved second audio range, and the moved third audio range.

21. The method of claim 20, wherein moving the second audio range includes using frequency compression on the second audio range.

22. The method of claim 20, wherein moving the third audio range includes using frequency compression on the third audio range.

23. The method of claim 20, further comprising applying a filter to at least one of the first audio range, the second audio range, and the third audio range.

24. The method of claim 20, wherein one or more of the audio ranges are based on external information indicative of audio to be received, and wherein the external information includes at least one of location information, time of day information, and historical data.

25. The method of claim 20, wherein moving the third audio range is time dependent.

26. The method of claim 20, wherein moving the third audio range is time independent.

27. The method of claim 20, wherein the audio input includes multiple channels.

28. The method of claim 27, further comprising generating a new channel of audio to be output, wherein the output signal includes the generated channel.

29. The method of claim 27, wherein each frequency range of the audio input for each of the multiple channels is identical.

30. The method of claim 20, further comprising:

using phase detection to determine a source direction of at least one of the first audio range, the second audio range, and the third audio range; and adjusting a phase of the output signal to correspond to the source direction.

31. A non-transitory computer-readable medium having instructions stored thereon, the instructions forming a program executable by a processing circuit to remap an audio range to a human perceivable range, the instructions comprising:

instructions for receiving audio from an audio input;

instructions for analyzing the audio to determine a first audio range, a second audio range, and a third audio range, wherein one or more of the first, second, and third audio ranges are determined based on external information indicative of audio to be received, and wherein the external information includes at least one of location information, time of day information, and historical data;

instructions for using frequency compression on the first audio range based on the bandwidths of the second audio range and third audio range to create a first open frequency range, wherein the first open frequency range is within the first audio range;

instructions for moving the second audio range into the first open frequency range to create a second open frequency range;

instructions for moving the third audio range into the second open frequency range; and instructions for providing audio output including the compressed first audio range, the moved second audio range, and the moved third audio range.

32. The non-transitory computer-readable medium of claim 31, wherein moving the second audio range includes using frequency compression on the second audio range.

33. The non-transitory computer-readable medium of claim 31, further comprising instructions for digitizing the received audio input prior to further processing.

34. The non-transitory computer-readable medium of claim 31, wherein the audio input includes multiple channels.

35. The non-transitory computer-readable medium of claim 34, further comprising instructions for processing a first channel of the audio input separately from a second channel of the audio input.

* * * * *